(12) United States Patent
Osanai (10) Patent No.: US 11,824,134 B2
(45) Date of Patent: Nov. 21, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Toshihide Osanai, Buzen Fukuoka (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 129 days.

(21) Appl. No.: 17/170,474

(22) Filed: Feb. 8, 2021

(65) Prior Publication Data

US 2022/0085232 A1 Mar. 17, 2022

(30) Foreign Application Priority Data

Sep. 17, 2020 (JP) .................................. 2020-156329

(51) Int. Cl.
*H01L 31/173* (2006.01)
*H01L 23/00* (2006.01)
(Continued)

(52) U.S. Cl.
CPC ............ *H01L 31/173* (2013.01); *H01L 24/05* (2013.01); *H01L 24/45* (2013.01); *H01L 24/73* (2013.01);
(Continued)

(58) Field of Classification Search
CPC ....... H01L 24/73; H01L 25/167; H01L 24/05; H01L 24/45; H01L 31/173;
(Continued)

(56) References Cited

U.S. PATENT DOCUMENTS 9,171,969 B2 10/2015 Yamamoto et al.
2005/0029633 A1* 2/2005 Yumura ................ H01L 31/167
257/E25.032
(Continued)

FOREIGN PATENT DOCUMENTS

JP S54001439 B2 1/1979
JP H11261102 A 9/1999
(Continued)

*Primary Examiner* — Mouloucoulaye Inoussa
(74) *Attorney, Agent, or Firm* — Kim & Stewart LLP (57) ABSTRACT

A semiconductor device includes a light-emitting element, a light-receiving element, a switching element, an input-side terminal, an output-side terminal, and a resin layer. The light-emitting element, the light-receiving element and the switching element are provided at the front side of the resin layer. The light-receiving element and the switching element are arranged in a first direction along the front side of the resin layer. The switching element is electrically connected to the light-receiving element. The light-receiving element is provided between the light-emitting element and the resin layer. The input-side and output-side terminals are provided at the backside of the resin layer. The input-side terminal is electrically connected to the light-emitting element. The output-side terminal is electrically connected to the switching element. At least one of the input-side or output-side terminals includes a portion overlapping the light-emitting element in a second direction from the resin layer to the light-emitting element.

16 Claims, 8 Drawing Sheets

(51) Int. Cl.
*H01L 25/16* (2023.01)
*H01L 31/0203* (2014.01)
*H01L 31/02* (2006.01)

(52) U.S. Cl.
CPC ........ *H01L 25/167* (2013.01); *H01L 31/0203* (2013.01); *H01L 31/02005* (2013.01)

(58) Field of Classification Search
CPC ........... H01L 31/02005; H01L 31/0203; H01L 31/167; H01L 25/165; H01L 33/62; H01L 23/645; H01L 33/486; H01L 23/3121; H01L 24/48; H01L 23/66; H01L 22/34; H01L 23/373; H01L 23/49827; H01L 23/49811; H01L 31/16; H01L 31/14; H01L 2224/8592; H01L 2224/48137; H01L 2924/13091; H01L 2224/0603; H01L 2924/181; H01L 2224/73265; H01L 2224/49171; H01L 2924/00012; H01L 2933/005; H01L 2224/05554; H01L 2224/48247; H01L 2224/48091; H01L 2924/00014; H01L 2224/04042; H01L 2924/19107; H01L 2924/12043; H01L 2924/15313; H01L 2224/32145; H01L 2224/48227; H01L 2224/48479; H01L 2924/06; H01L 2224/32505; H01L 2224/32501; H05K 1/0243; H05K 1/141; H05K 2201/10053; H03K 17/785; H03K 2217/0081; H03K 2217/0009; H02S 40/44; G01R 31/265; G01R 31/3004; G01R 31/31728; Y02E 10/50; Y02E 10/60
USPC .............................. 257/82, 666, 782, 25.032
See application file for complete search history.

(56) References Cited

U.S. PATENT DOCUMENTS

| | | | |
|---|---|---|---|
| 2005/0189474 A1* | 9/2005 | Tomioka | H01L 25/167 250/214.1 |
| 2014/0084305 A1* | 3/2014 | Fujimoto | H01L 31/173 257/82 |
| 2014/0284629 A1* | 9/2014 | Takai | H03K 17/785 257/82 |
| 2014/0374776 A1* | 12/2014 | Nakasuji | H01L 25/167 257/82 |
| 2015/0069423 A1* | 3/2015 | Yamamoto | H01L 31/0203 257/782 |
| 2015/0262985 A1* | 9/2015 | Takai | H01L 31/167 257/82 |
| 2015/0263184 A1* | 9/2015 | Takai | H01L 23/645 257/82 |
| 2016/0268241 A1* | 9/2016 | Yamamoto | H01L 31/167 |
| 2017/0012506 A1 | 1/2017 | Naito et al. | |
| 2017/0040305 A1* | 2/2017 | Kugiyama | H01L 25/165 |
| 2017/0069610 A1* | 3/2017 | Takai | H01L 23/373 |
| 2017/0176519 A1* | 6/2017 | Takai | H01L 22/34 |
| 2017/0186738 A1* | 6/2017 | Okumura | H01L 31/14 |
| 2020/0091367 A1* | 3/2020 | Nakashima | H01L 25/167 |
| 2020/0194411 A1* | 6/2020 | Saito | H01L 31/167 |

FOREIGN PATENT DOCUMENTS

| | | |
|---|---|---|
| JP | 2002217234 A | 8/2002 |
| JP | 2010034103 A | 2/2010 |
| JP | 2015056531 A | 3/2015 |
| JP | 2017022961 A | 1/2017 |
| JP | 2017033961 A | 2/2017 |

* cited by examiner

SEMICONDUCTOR DEVICE

CROSS-REFERENCE TO RELATED APPLICATIONS

This application is based upon and claims the benefit of priority from Japanese Patent Application No. 2020-156329, filed on Sep. 17, 2020; the entire contents of which are incorporated herein by reference.

FIELD

Embodiments relate to a semiconductor device.

BACKGROUND

A semiconductor device includes a semiconductor chip sealed by a resin on a glass epoxy substrate. In such a semiconductor device, terminals that connect the semiconductor chip to an external circuit are provided at the back surface of the glass epoxy substrate. Therefore, intermediate interconnects that electrically connect the semiconductor chip and the terminals are provided inside the glass epoxy substrate. On the other hand, to operate the semiconductor chip at a high speed, it is desirable to shorten the intermediate interconnects electrically connecting the semiconductor chip and the terminals.

DETAILED DESCRIPTION

According to one embodiment, a semiconductor device includes a light-emitting element, a light-receiving element, at least a switching element, at least an input-side terminal, at least an output-side terminal, a first resin layer, and a second resin layer. The light-receiving element is optically coupled with the light-emitting element. The switching element is electrically connected to the light-receiving element. The input-side terminal is electrically connected to the light-emitting element. The output-side terminal is electrically connected to the switching element. The first resin layer includes a front side and a backside opposite to the front side. The light-emitting element, the light-receiving element and the switching element are provided at the front side. The light-receiving element is provided between the light-emitting element and the first resin layer. The light-receiving element and the switching element are arranged in a first direction along the front side of the first resin layer. The input-side terminal and the output-side terminal are provided at the backside of the first resin layer. The input-side terminal is apart from the output-side terminal. At least one of the input-side terminal or the output-side terminal includes a portion overlapping the light-receiving element in a second direction from the first resin layer toward the light-emitting element. The second resin layer seals the light-emitting, light-receiving, and switching elements at the front side of the first resin layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
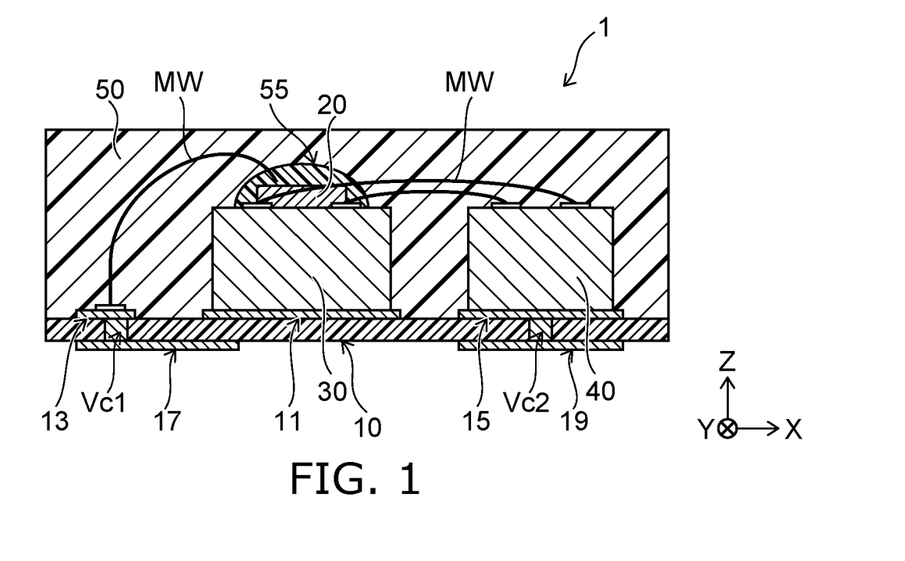
FIG. 1 is a schematic cross-sectional view showing a semiconductor device according to a first embodiment.

FIG. 1 is a schematic cross-sectional view showing a semiconductor device 1 according to a first embodiment. The semiconductor device 1 is, for example, a photo-relay.

The semiconductor device 1 includes a light-emitting element 20, a light-receiving element 30, and a switching element 40. The light-emitting element 20 is, for example, a light-emitting diode. Moreover, the light-receiving element 30 includes, for example, multiple photodiodes provided on a silicon substrate. The switching element 40 is, for example, a MOS (Metal Oxide Semiconductor) transistor.

As shown in FIG. 1, the light-emitting element 20 is mounted on the light-receiving element 30. For example, the light-emitting element 20 is bonded on the front surface of the light-receiving element 30 via a transparent adhesive layer. For example, the light-emitting element 20 emits light from the backside and is mounted with the back surface toward the light-receiving element 30.

The light-receiving element 30 and the switching element 40 are mounted on a resin layer 10. The resin layer 10 is located at the backside of the light-receiving element 30 and the backside of the switching element 40. The resin layer 10 is, for example, a polyimide layer. The thickness in the direction from the back surface toward the front surface of the resin layer 10 (in the Z-direction) is, for example, not more than 50 micrometers.

A mount pad 11, a bonding pad 13, and a mount pad 15 are provided on the front surface of the resin layer 10. The mount pad 11, the bonding pad 13, and the mount pad 15 are apart from each other. For example, the mount pad 11 is located between the bonding pad 13 and the mount pad 15. The mount pad 11, the bonding pad 13, and the mount pad 15 include copper, for example.

The light-emitting element 20 is electrically connected to the bonding pad 13 via a metal wire MW. For example, the light-receiving element 30 is mounted on the mount pad 11 via an adhesive layer (not illustrated) such as a die attach film, etc. For example, the switching element 40 is mounted on the mount pad 15 via a conductive paste (not illustrated).

The mount pad 11 is located between the resin layer 10 and the light-receiving element 30. The mount pad 15 is located between the resin layer 10 and the switching element 40.

The light-emitting element 20 is sealed by a resin layer 55 on the light-receiving element 30. The resin layer 55 includes, for example, silicone. The resin layer 55 is formed on the light-receiving element 30 by, for example, potting.

The light-receiving element 30 and the switching element 40 are sealed by a resin layer 50 on the resin layer 10. The resin layer 50 covers the resin layer 55. The resin layer 50 is, for example, a polyimide layer or an epoxy resin.

An input-side terminal 17 and an output-side terminal 19 are provided on the back surface of the resin layer 10. The input-side terminal 17 and the output-side terminal 19 are apart from each other. The input-side terminal 17 faces the bonding pad 13 with a portion of the resin layer 10 interposed. The output-side terminal 19 faces the mount pad 15 with another portion of the resin layer 10 interposed.

The resin layer 10 includes a via contact Vc1 provided between the bonding pad 13 and the input-side terminal 17, and a via contact Vc2 provided between the mount pad 15 and the output-side terminal 19. The input-side terminal 17 is electrically connected to the bonding pad 13 by the via contact Vc1 that extends through the resin layer 10 in the Z-direction. The output-side terminal 19 is electrically connected to the mount pad 15 by the via contact Vc2 that extends through the resin layer 10 in the Z-direction.

The light-emitting element 20 is electrically connected to the input-side terminal 17 via the metal wire MW, the bonding pad 13, and the via contact Vc1. The switching element 40 is electrically connected to the output-side terminal 19 via the mount pad 15 and the via contact Vc2.

For example, the via contacts Vc1 and Vc2 have the same Z-direction lengths as the thickness in the Z-direction of the resin layer 10. The thickness of the resin layer 10 is not more than 50 μm; and the length of the electrical connection between the bonding pad 13 and the input-side terminal 17 is the length of the via contact Vc1. The length of the electrical connection between the switching element 40 and the output-side terminal 19 is the length of the via contact Vc2. The parasitic inductance that is caused by the interconnect length inside the resin layer 10 can be reduced thereby, and the semiconductor device 1 can operate at a high speed.

The input-side terminal 17 further includes a portion overlapping the light-receiving element 30 when viewed from the Z-direction. In other words, the resin layer 10 includes a portion positioned between the light-receiving element 30 and a portion of the input-side terminal 17.

For example, when performing ultrasonic bonding of the metal wires MW to the light-emitting element 20 and the light-receiving element 30, the ultrasonic waves are absorbed by the resin layer 10, and there are cases where the intensity of the ultrasonic waves necessary for the bonding is not obtained. Therefore, there are cases where the bonding strength is insufficient, and the reliability of the semiconductor device 1 decreases.

In the configuration of the embodiment, the light-receiving element 30 and a portion of the input-side terminal 17 overlap, and the ultrasonic waves are efficiently transmitted from the input-side terminal 17 to the light-receiving element 30. The bonding strength of the metal wires MW can be increased thereby, and the reliability of the semiconductor device 1 can be increased.

Figure 2:
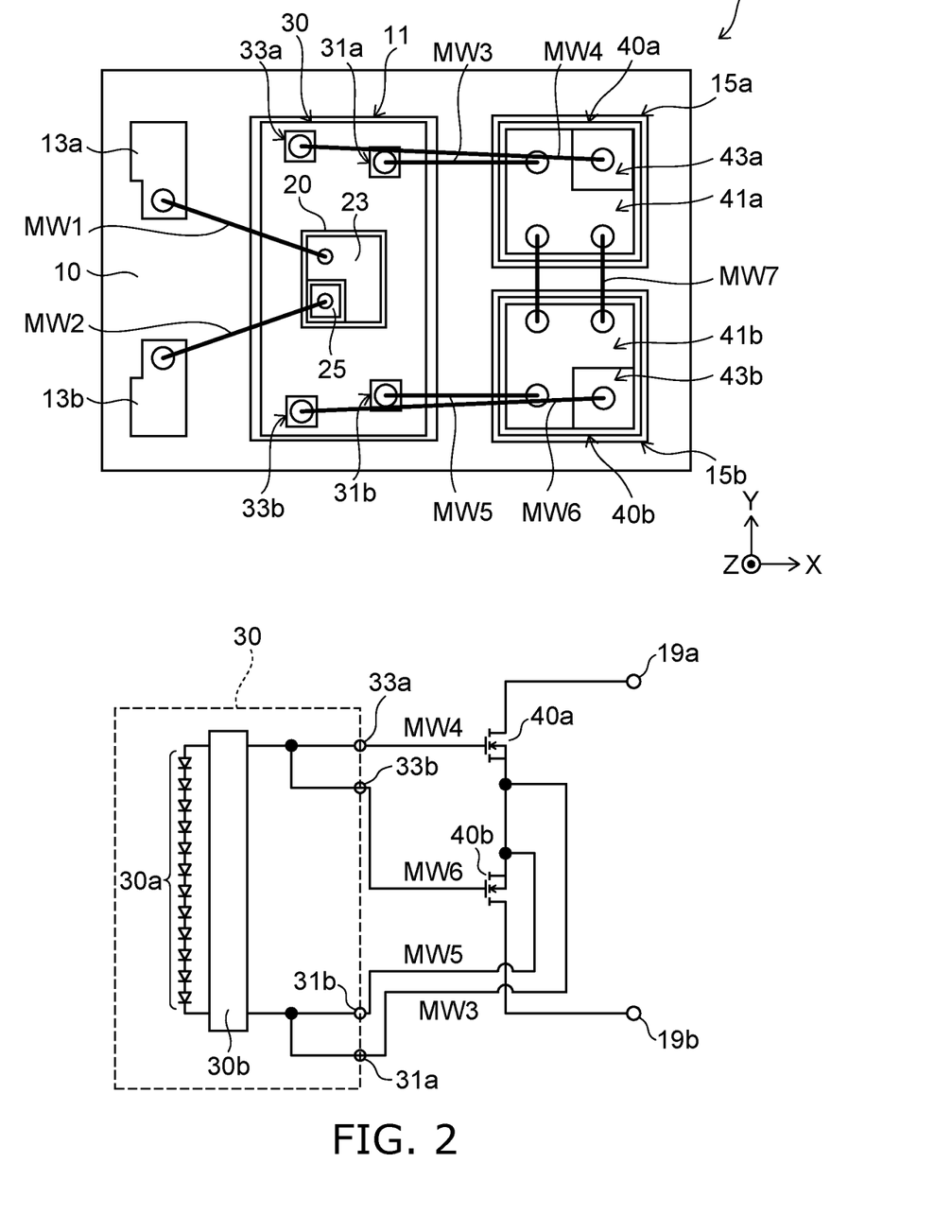
FIG. 2 is a schematic view showing the semiconductor device according to the first embodiment.

FIG. 2 is a schematic view showing the semiconductor device 1 according to the first embodiment. FIG. 2 includes a plan view and an equivalent circuit diagram showing the layout on the front surface of the resin layer 10.

As shown in FIG. 2, the semiconductor device 1 includes bonding pads 13a and 13b and switching elements 40a and 40b. The bonding pads 13a and 13b are electrically connected respectively to input-side terminals 17a and 17b (referring to FIG. 3A). The switching elements 40a and 40b are electrically connected respectively to output-side terminals 19a and 19b (referring to FIG. 2B). In the specification, the bonding pads 13a and 13b may be generally referred to as the bonding pad 13. This is similar for the other components as well.

The light-emitting element 20 includes a first electrode 23 and a second electrode 25. The first electrode 23 is, for example, a p-electrode. The second electrode 25 is, for example, an n-electrode. The first electrode 23 is electrically connected to the bonding pad 13a via a metal wire MW1. The second electrode 25 is electrically connected to the bonding pad 13b via a metal wire MW2.

The light-receiving element 30 includes, for example, cathode terminals 31a and 31b and anode terminals 33a and 33b. The switching element 40a includes, for example, a source electrode 41a and a gate electrode 43a. The switching element 40b includes, for example, a source electrode 41b and a gate electrode 43b.

The switching elements 40a and 40b are arranged in the Y-direction on the resin layer 10. In the light-receiving element 30, the cathode terminal 31a and the anode terminal 33a are located at one Y-direction end, and the cathode terminal 31b and the anode terminal 33b are located at the other Y-direction end.

The cathode terminal 31a of the light-receiving element 30 is electrically connected to the source electrode 41a of the first switching element 40a via a metal wire MW3. The anode terminal 33a of the light-receiving element 30 is electrically connected to the gate electrode 43a of the first switching element 40a via a metal wire MW4.

The cathode terminal 31b of the light-receiving element 30 is electrically connected to the source electrode 41b of the second switching element 40b via a metal wire MW5. The anode terminal 33b of the light-receiving element 30 is electrically connected to the gate electrode 43b of the second switching element 40b via a metal wire MW6.

The source electrode 41a of the first switching element 40a is electrically connected to the source electrode 41b of the second switching element 40b via a metal wire MW7.

In the semiconductor device 1, for example, a current signal is input to the light-emitting element 20 from the input-side terminals 17a and 17b (referring to FIG. 3A) via the bonding pads 13a and 13b and the metal wires MW1 and MW2. The light-emitting element 20 radiates, toward the light-receiving element 30, an optical signal corresponding to the input current signal.

The light-receiving element 30 includes, for example, a photodiode array 30a and a control circuit 30b. The photodiode array 30a receives the optical signal of the light-emitting element 20 and outputs a voltage signal to the control circuit 30b. The control circuit 30b outputs a voltage signal between the gate and source of the first switching element 40a via the cathode terminal 31a and the anode terminal 33a. The control circuit 30b also outputs a voltage signal between the gate and source of the second switching element 40b via the cathode terminal 31b and the anode terminal 33b.

The photodiode array 30a receives the optical signal radiated from the light-emitting element 20 and turns on the first switching element 40a and the second switching element 40b by applying a prescribed voltage between the gate and source for each of the first switching element 40a and the second switching element 40b. Electrical conduction between the output-side terminal 19a and the output-side terminal 19b is caused thereby.

In the embodiment, the parasitic inductance can be reduced between the input-side terminal 17a and the bonding pad 13a and between the input-side terminal 17b and the bonding pad 13b. Also, the parasitic inductance can be reduced between the first switching element 40a and the output-side terminal 19a and between the second switching element 40b and the output-side terminal 19b. Thereby, a signal that corresponds to high frequency modulation of the input signal can be output via the first switching element 40a and the second switching element 40b.

Figure 3A:
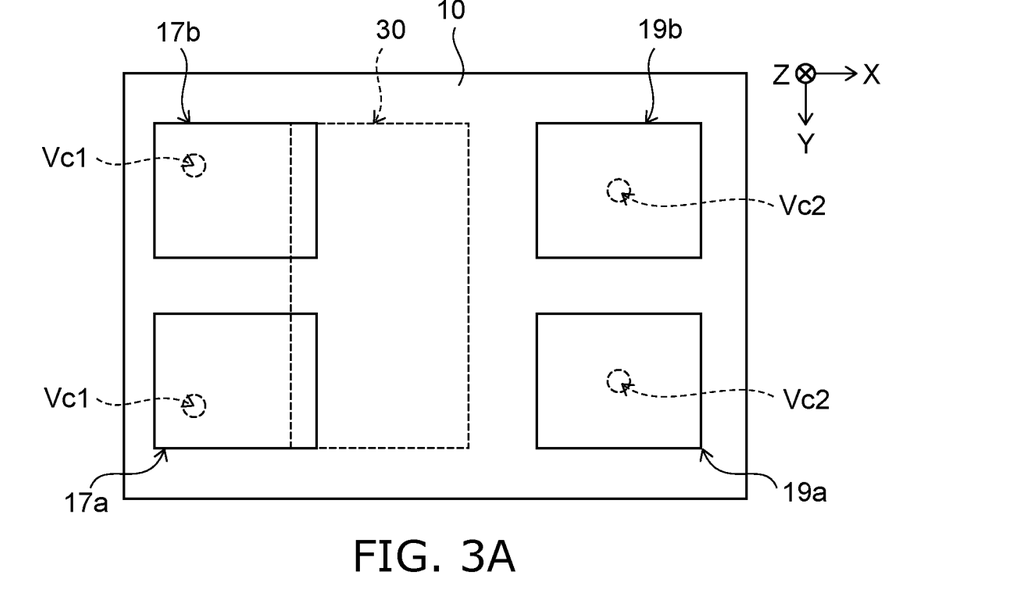
FIGS. 3A and 3B are schematic plan views showing the input-side terminals and the output-side terminals of the semiconductor device according to the first embodiment.
Figure 3B:
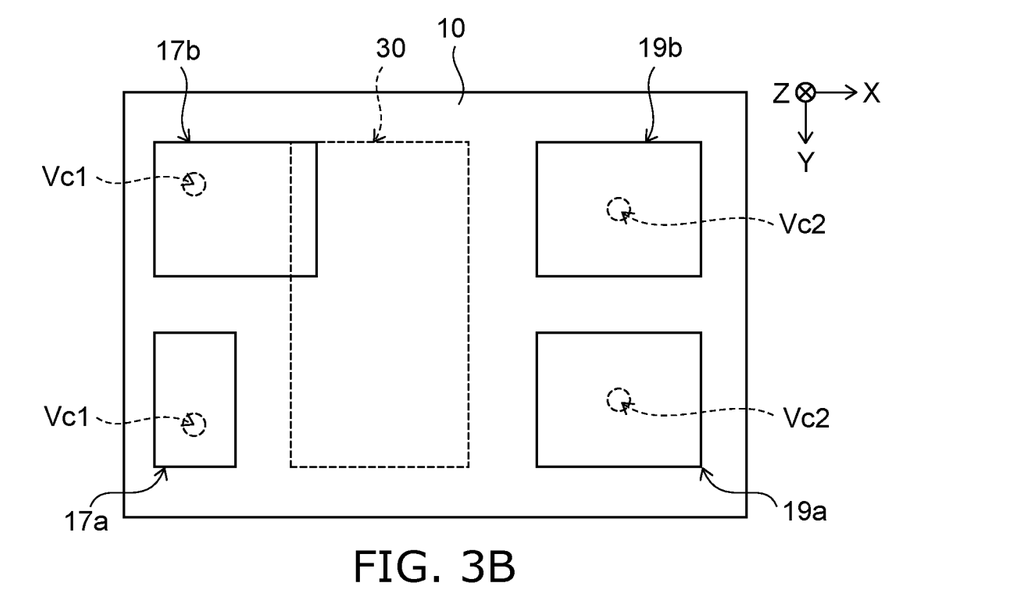

FIGS. 3A and 3B are schematic plan views showing the input-side terminals and the output-side terminals of the semiconductor device 1 according to the first embodiment. FIGS. 3A and 3B show the input-side terminals 17a and 17b and the output-side terminals 19a and 19b located on the back surface of the resin layer 10. The broken line in the drawing illustrates the position of the light-receiving element 30.

As shown in FIG. 3A, the input-side terminals 17a and 17b each include a portion overlapping the light-receiving element 30 when viewed from the Z-direction. Thereby, the light-emitting element 20 and the light-receiving element 30 are linked via the resin layer 10 with the portions of the input-side terminal 17. Therefore, when bonding the metal wires MW (referring to FIG. 2A), for example, the ultrasonic waves that are supplied to the bonding balls can be transmitted to the electrodes of the front surface of the light-emitting element 20 (referring to FIG. 2) and the terminals of the light-receiving element 30 (referring to FIG. 2); and the metal wires can be securely compression-bonded by the vibration.

In the example shown in FIG. 3B, the input-side terminal 17b includes a portion overlapping the light-receiving element 30 when viewed from the Z-direction. On the other hand, the input-side terminal 17a does not overlap the light-receiving element 30 when viewed from the Z-direction. Thus, one of the input-side terminal 17a or 17b may overlap the light-receiving element 30.

Figure 4A:
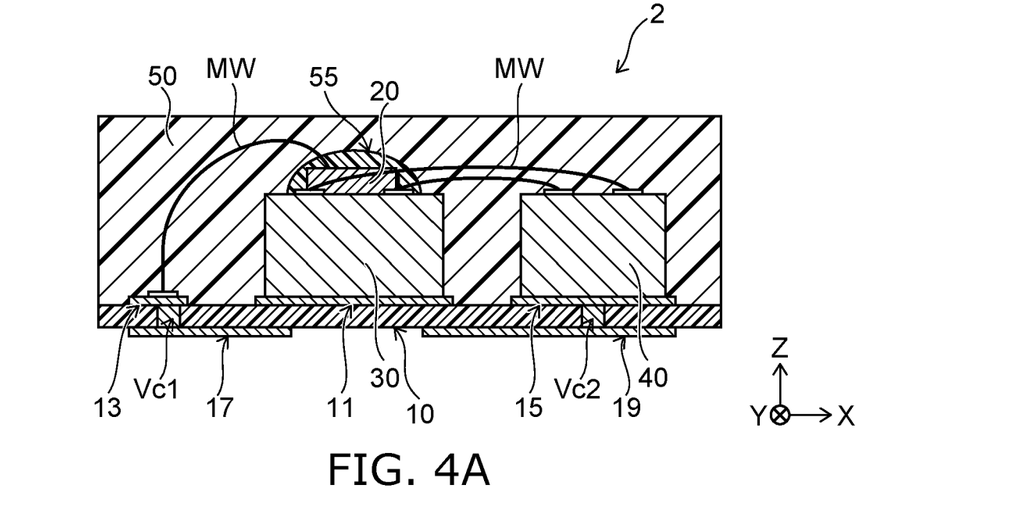
FIG. 4A is a schematic cross-sectional view showing a semiconductor device according to a modification of the first embodiment.
Figure 4B:
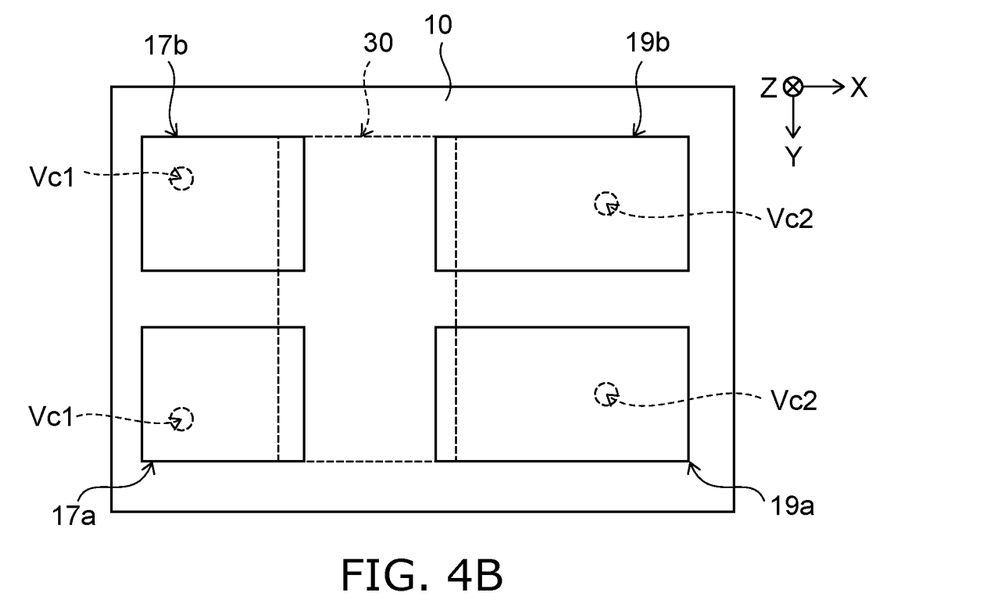
FIG. 4B is a schematic plan view showing the semiconductor device according to the modification of the first embodiment.

FIGS. 4A and 4B are, respectively, a schematic cross-sectional view and a schematic plan view showing a semiconductor device 2 according to a modification of the first embodiment. FIG. 4A is a schematic cross-sectional view of the semiconductor device 2. FIG. 4B shows the input-side terminals 17a and 17b and the output-side terminals 19a and 19b located on the back surface of the resin layer 10. The broken line in the drawing illustrates the position of the light-receiving element 30.

In the semiconductor device 2 as shown in FIG. 4A, the input-side terminal 17 and the output-side terminal 19 each extend below the light-receiving element 30 along the back surface of the resin layer 10. In other words, the resin layer 10 includes a portion that is positioned between the input-side terminal 17 and the light-receiving element 30, and another portion that is positioned between the output-side terminal 19 and the light-receiving element 30.

As shown in FIG. 4B, the input-side terminals 17a and 17b each overlap the light-receiving element 30 when viewed from the Z-direction. Also, the output-side terminals 19a and 19b each overlap the light-receiving element 30 when viewed from the Z-direction.

Alternatively, one of the input-side terminal 17a or 17b may overlap the light-receiving element 30 when viewed from the Z-direction (referring to FIG. 3B). Also, one of the output-side terminal 19a or 19b may overlap the light-receiving element 30 when viewed from the Z-direction.

Figure 5A:
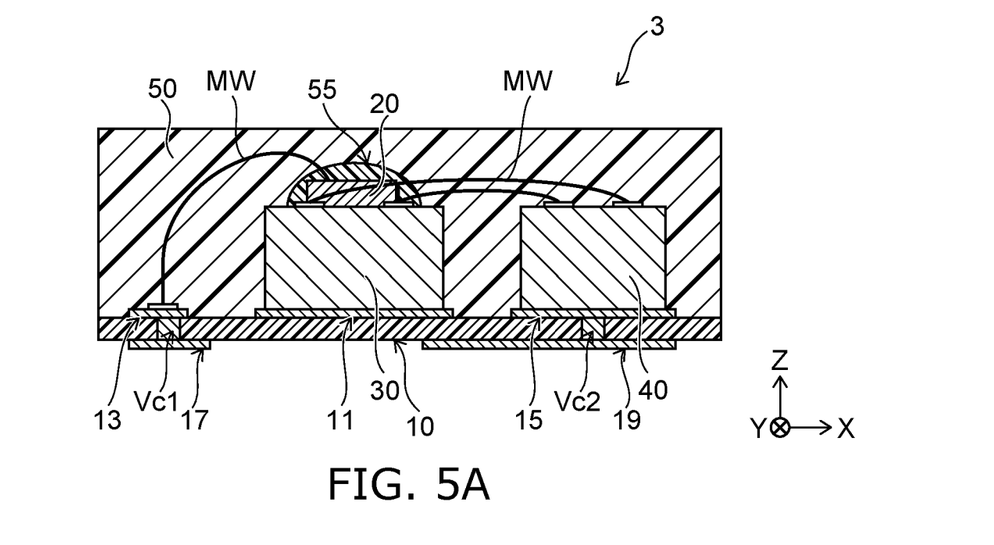
FIG. 5A is a schematic cross-sectional view showing a semiconductor device according to another modification of the first embodiment.
Figure 5B:
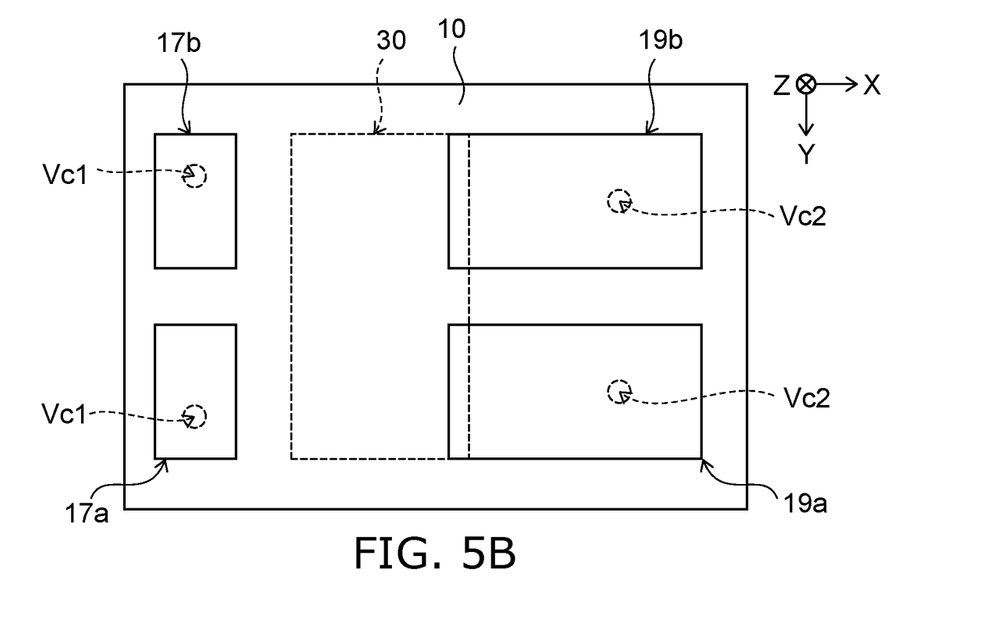
FIG. 5B is a schematic plan view showing the semiconductor device according to said another modification of the first embodiment.

FIGS. 5A and 5B are, respectively, a schematic cross-sectional view and a schematic plan view showing a semiconductor device 3 according to another modification of the first embodiment. FIG. 5A is a schematic cross-sectional view of the semiconductor device 3. FIG. 5B shows the input-side terminals 17a and 17b and the output-side terminals 19a and 19b located on the back surface of the resin layer 10. The broken line in the drawing illustrates the position of the light-receiving element 30.

In the semiconductor device 3 as shown in FIG. 5A, the output-side terminal 19 extends below the light-receiving element 30 along the back surface of the resin layer 10. In other words, the resin layer 10 includes a portion positioned between the output-side terminal 19 and the light-receiving element 30.

As shown in FIG. 5B, the input-side terminals 17a and 17b do not overlap the light-receiving element 30 when viewed from the Z-direction. The output-side terminals 19a and 19b each overlap the light-receiving element 30 when viewed from the Z-direction. Alternatively, one of the output-side terminal 19a or 19b may overlap the light-receiving element 30.

Second Embodiment

Figure 6:
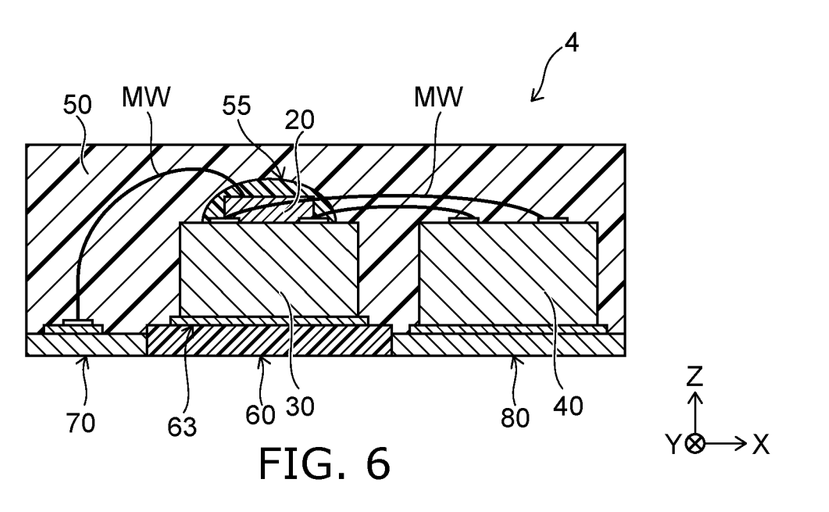
FIG. 6 is a schematic cross-sectional view showing a semiconductor device according to a second embodiment.

FIG. 6 is a schematic cross-sectional view showing a semiconductor device 4 according to a second embodiment. The semiconductor device 4 includes a resin layer 60, an input pad 70, and an output pad 80 instead of the resin layer 10, the input-side terminal 17, and the output-side terminal 19.

The resin layer 60 is located between the input pad 70 and the output pad 80. For example, the resin layer 60, the input pad 70, and the output pad 80 have thicknesses in the Z-direction of not more than 100 μm. It is favorable for the thickness in the Z-direction of the resin layer 60 to be greater than the thicknesses in the Z-direction of the input pad 70 and the output pad 80. The resin layer 60 is, for example, a polyimide layer. The input pad 70 and the output pad 80 are metal plates including, for example, copper.

In the example, the light-receiving element 30 is mounted on the resin layer 60 via, for example, a not-illustrated adhesive layer. For example, the light-receiving element 30 may be mounted on a mount pad 63. The light-emitting element 20 is bonded on the front surface of the light-receiving element 30 via, for example, an adhesive layer (not illustrated) that is transparent to the light radiated from the light-emitting element 20. The light-emitting element 20 is electrically connected to the input pad 70 via, for example, the metal wire MW.

The switching element 40 is mounted on the output pad 80 via, for example, a conductive paste (not illustrated). The switching element 40 is electrically connected to the light-receiving element 30 via, for example, another metal wire MW.

The light-emitting element 20 is sealed by the resin layer 55 at the front side of the light-receiving element 30. The light-receiving element 30 and the switching element 40 are sealed by the resin layer 50 on the resin layer 60 and on the output pad 80. The resin layer 50 covers the resin layer 55.

In the example, the metal wire MW that is linked to the light-emitting element 20 is directly bonded to the input pad 70. The switching element 40 is directly mounted to the output pad 80. The attenuation of the high frequency signal passing through the switching element 40 can be reduced thereby. In other words, the transmission characteristics of the high frequency signal transmitted from the input side to the output side can be improved.

Figure 7A:
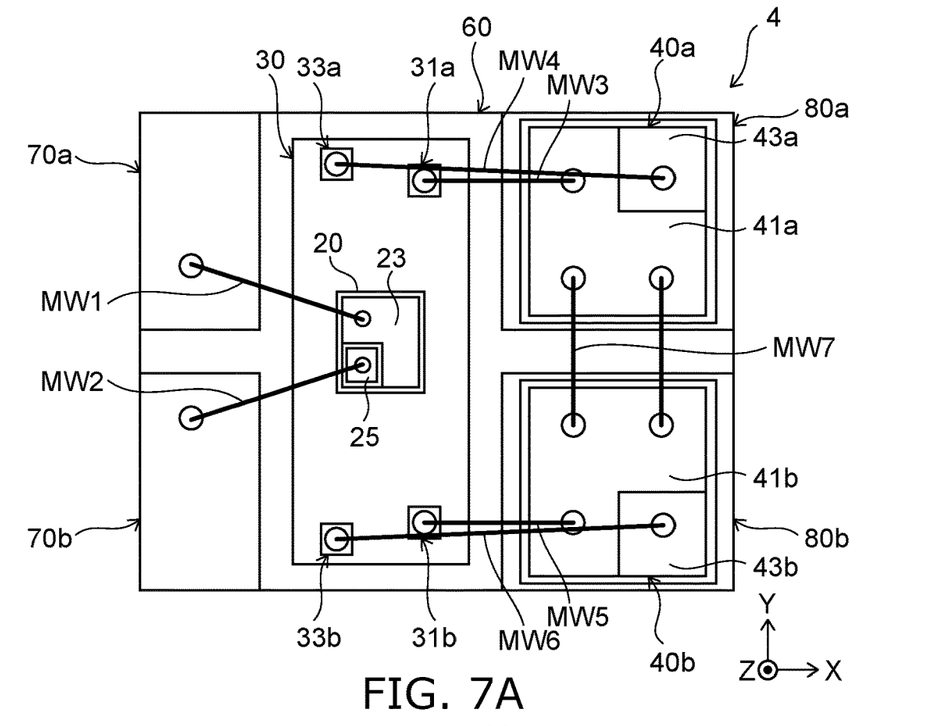
FIGS. 7A and 7B are schematic plan views showing the semiconductor device according to the second embodiment.
Figure 7B:
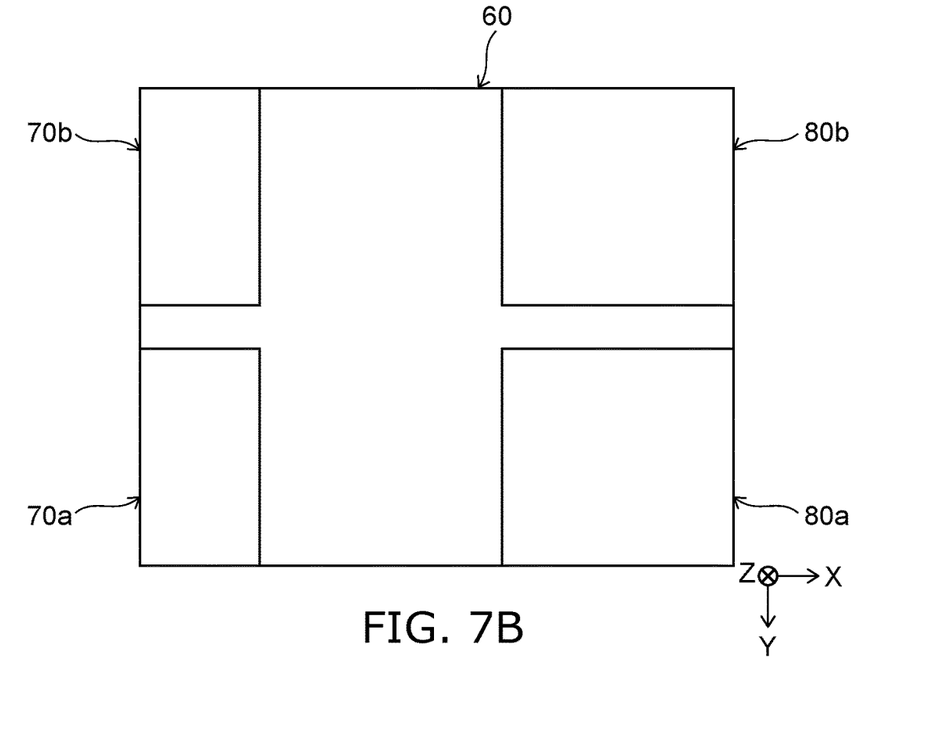

FIGS. 7A and 7B are schematic plan views showing the semiconductor device 4 according to the second embodiment. FIG. 7A is a plan view showing the layout of the front side of the semiconductor device 4. FIG. 7B is a plan view showing the layout of the backside of the semiconductor device 4.

As shown in FIG. 7A, the semiconductor device 4 includes input pads 70a and 70b, the switching elements 40a and 40b, and output pads 80a and 80b. The switching elements 40a and 40b are mounted respectively on the output pads 80a and 80b. The resin layer 60 extends between the input pad 70a and the input pad 70b and between the output pad 80a and the output pad 80b.

The first electrode 23 of the light-emitting element 20 is electrically connected to the input pad 70a via the metal wire MW1. The second electrode 25 of the light-emitting element 20 is electrically connected to the input pad 70b via the metal wire MW2.

The cathode terminal 31a of the light-receiving element 30 is electrically connected to the source electrode 41a of the first switching element 40a via the metal wire MW3. The anode terminal 33a of the light-receiving element 30 is electrically connected to the gate electrode 43a of the first switching element 40a via the metal wire MW4.

The cathode terminal 31b of the light-receiving element 30 is electrically connected to the source electrode 41b of the second switching element 40b via the metal wire MW5. The anode terminal 33b of the light-receiving element 30 is electrically connected to the gate electrode 43b of the second switching element 40b via the metal wire MW6.

The source electrode 41a of the first switching element 40a is electrically connected to the source electrode 41b of the second switching element 40b via the metal wire MW7.

As shown in FIG. 7B, the input pads 70a and 70b and the output pads 80a and 80b are not covered with the resin layer 60 at the backside.

A method for manufacturing the semiconductor device 4 will now be described with reference to FIGS. 8A to 8E. FIGS. 8A to 8E are schematic cross-sectional views showing manufacturing processes of the semiconductor device 4 according to the second embodiment.

Figure 8A:
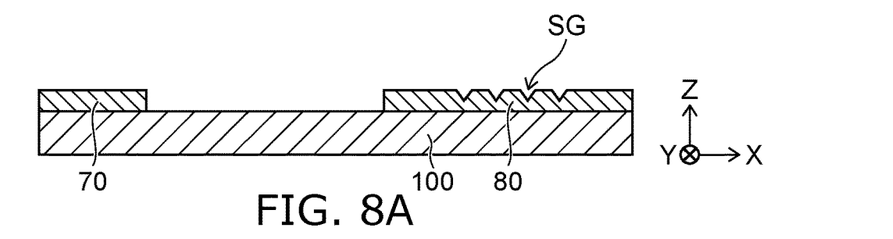
FIGS. 8A to 8E are schematic cross-sectional views showing manufacturing processes of the semiconductor device according to the second embodiment.

As shown in FIG. 8A, the input pad 70 and the output pad 80 are located on a support plate 100 and are apart from each other. The output pad 80 includes, for example, a trench SG at the front side. For example, the input pad 70 and the output pad 80 are fixed on the support plate via adhesive sheets (not illustrated). The support plate 100 is, for example, a stainless steel plate.

Figure 8B:
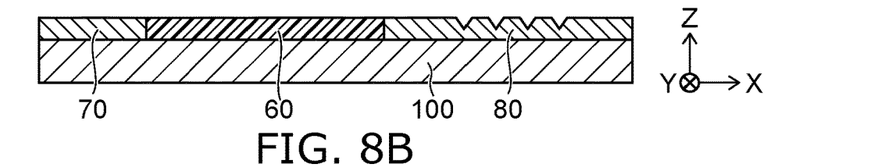

As shown in FIG. 8B, the resin layer 60 is formed in the space between the input pad 70 and the output pad 80, between the input pads 70a and 70b, and between the output pads 80a and 80b. For example, the resin layer 60 is formed by molding a resin such as polyimide, etc., at the front side of the support plate 100, and by subsequently polishing the resin formed on the input pad 70 and the output pad 80 so that the portion of the resin filled between the input pad 70 and the output pad 80 remains. For example, the resin layer 60 is formed by transfer molding or compression molding. The resin layer 60 also may be filled into the space between the input pad 70 and the output pad 80 by using, for example, a dispenser.

Figure 8C:
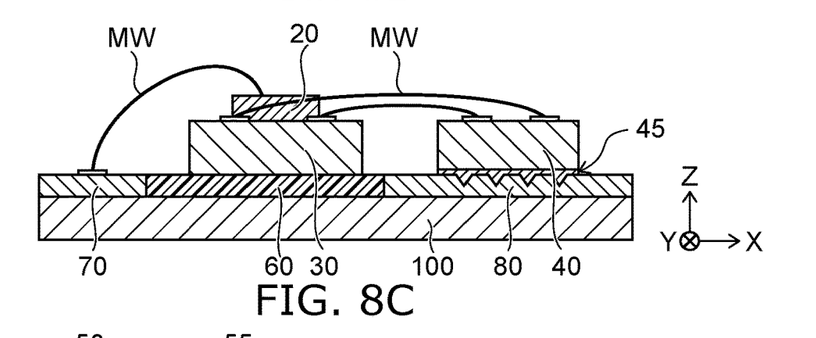

As shown in FIG. 8C, the light-receiving element 30 is mounted on the resin layer 60, and the switching element 40 is mounted on the output pad 80. The light-receiving element 30 is mounted via, for example, a die attach film (not illustrated) adhered to the backside of the light-receiving element 30. For example, the switching element 40 is mounted via a conductive paste 45 coated onto the front surface of the output pad 80. For example, the trench SG prevents the spreading of the conductive paste 45 outside the switching element 40.

The light-emitting element 20 is bonded on the light-receiving element 30 via, for example, an adhesive (not illustrated) that is transparent to the radiated light. Continuing, by the metal wires MW, the light-emitting element 20 and the input pad 70 are electrically connected and the light-receiving element 30 and the switching element 40 are electrically connected.

Figure 8D:
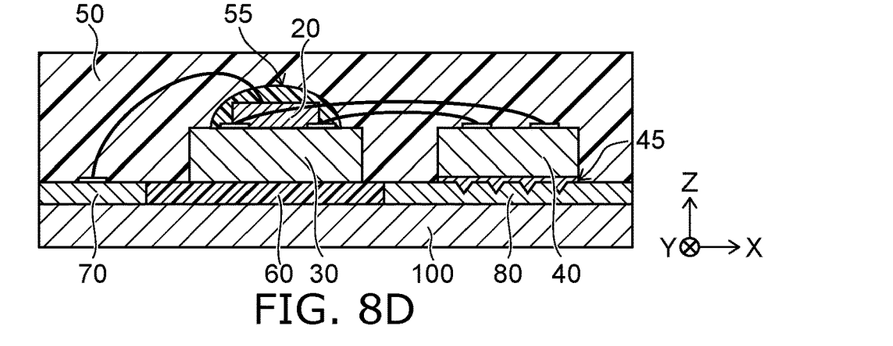

As shown in FIG. 8D, the light-emitting element 20 is sealed on the light-receiving element 30 by the resin layer 55. The resin layer 55 is potted on the light-receiving element 30 by using, for example, a dispenser.

Subsequently, the resin layer 50 that covers the light-emitting element 20, the light-receiving element 30, and the switching element 40 is molded. The conductive paste 45 is prevented from spreading outside the switching element 40 by providing the trench SG in the output pad 80. Thereby, the conductive paste 45 can be prevented from existing between the resin layer 50 and the output pad 80, and the adhesion between the resin layer 50 and the output pad 80 can be improved.

Figure 8E:
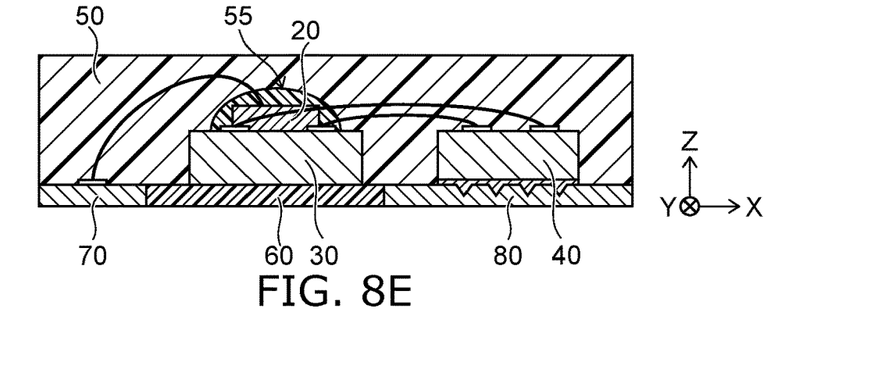

As shown in FIG. 8E, the support plate 100 is detached after curing the resin layer 50. The input pad 70 and the output pad 80 are exposed at the backside of the semiconductor device 4 (referring to FIG. 7B).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a light-emitting element;
   a light-receiving element optically coupled with the light-emitting element;
   a first switching element electrically connected to the light-receiving element;

a second switching element electrically connected to the light-receiving element and the first switching element;
a first input-side terminal electrically connected to the light-emitting element;
a second input-side terminal apart from the first input-side terminal, the second input-side terminal being electrically connected to the light-emitting element;
a first output-side terminal electrically connected to the first switching element;
a second output-side terminal apart from the first output-side terminal, the second output-side terminal being electrically connected to the second switching element;
a first resin layer having a front side and a backside opposite to the front side,
the light-emitting element, the light-receiving element, and the first and second switching elements being provided at the front side of the first resin layer,
the light-receiving element being provided between the light-emitting element and the first resin layer, the light-receiving element and each of the first and second switching elements being arranged in a first direction along the front side,
the first and second input-side terminals and the first and second output-side terminals being provided at the backside of the first resin layer, the first and second input-side terminals being apart in the first direction from the first and second output-side terminals,
the light-receiving element being provided, via the first resin layer, on edge portions of the first output-side terminal and the second output-side terminal; and
a second resin layer sealing the light-emitting element, the light-receiving element, and the first and second switching elements at the front side of the first resin layer.

2. The device according to claim 1, further comprising:
a first bonding pad provided at the front side of the first resin layer and electrically connected to the light-emitting element via a first metal wire;
a first via contact extending through the first resin layer and electrically connecting the first bonding pad and the first input-side terminal;
a second bonding pad provided at the front side of the first resin layer and electrically connected to the light-emitting element via a second metal wire;
a second via contact extending through the first resin layer and electrically connecting the second bonding pad and the second input-side terminal;
a first mount pad provided between the first resin layer and the first switching element and electrically connected to the first switching element;
a third via contact extending through the first resin layer and electrically connecting the first switching element and the first output-side terminal;
a second mount pad provided between the first resin layer and the second switching element and electrically connected to the second switching element; and
a fourth via contact extending through the first resin layer and electrically connecting the second switching element and the second output-side terminal.

3. The device according to claim 2, wherein
the light-emitting element includes a back surface connected to the light-receiving element, a front surface at a side opposite to the back surface, and first and second electrodes provided on the front surface, and
the first and second metal wires are bonded to the first and second electrodes, respectively, on the front surface of the light-emitting element.

4. The device according to claim 2, wherein
the second resin layer covers the first and second metal wires and the first and second bonding pads.

5. The device according to claim 1, wherein
the first resin layer has a thickness of not more than 50 micrometers in a second direction perpendicular to the front side of the first resin layer.

6. The device according to claim 1, further comprising:
a third mount pad provided between the first resin layer and the light-receiving element.

7. The device according to claim 1, further comprising:
a third resin layer sealing the light-emitting element on the light-receiving element, wherein
the second resin layer covers the third resin layer.

8. The device according to claim 1, wherein
each of the first and second switching elements is a MOS transistor,
the MOS transistor includes a source electrode, a drain electrode, and a gate electrode,
the light-receiving element includes a first couple of electrodes electrically connected respectively to the source electrodes of the first and second switching elements and a second couple of electrodes electrically connected respectively to the gate electrodes of the first and second switching elements via metal wires, and
each of the first and second output-side terminals is electrically connected to the drain electrodes of the first and second switching elements.

9. The device according to claim 8, wherein
each of the first and second switching elements includes:
a back surface facing the first resin layer; and
a front surface at a side opposite to the back surface of the switching element,
the source electrode and the gate electrode being provided on each front surface of the first and second switching elements, the drain electrode being provided on each back surface of the first and second switching elements, and
the light-receiving element includes:
a back surface facing the first resin layer; and
a front surface at a side opposite to the back surface of the light-receiving element,
the front surface of the light-receiving element including a first region connected to the light-emitting element and a second region other than the first region,
the light-receiving element including the first and second couples of electrodes on the second region.

10. The device according to claim 1,
wherein the light-receiving element is provided, via the first resin layer, on edge portions of the first input-side terminal, the second input-side terminal, the first output-side terminal, and the second output-side terminal.

11. A semiconductor device, comprising:
a light-emitting element;
a light-receiving element optically coupled with the light-emitting element;
a switching element electrically connected to the light-receiving element
a first metal plate electrically connected to the light emitting element by a metal wire, the first metal plate having a front surface and a back surface opposite to the front surface, the metal wire being bonded to the front surface of the first metal plate;

a second metal plate having a front surface and a back surface opposite to the front surface, the switching element being provided on the front surface of the second metal plate and electrically connected to the second metal plate;

a first resin layer provided between the first metal plate and the second metal plate, the first resin layer having a front surface and a back surface opposite to the front surface, the back surface of the first resin layer being flush and aligned with the back surfaces of the first and second metal plates, the light-receiving element being bonded to the front surface of the first resin layer, the light-emitting element being provided on the light-receiving element; and a second resin layer covering the light emitting element, the light receiving element, the switching element, the front surface of the first resin layer, the front surface of the first metal plate, and the front surface of the second metal plate.

12. The device according to claim 11, further comprising:
a third resin layer covering the light-emitting element on the light-receiving element,
the third resin layer being provided between the second resin layer and the light-receiving element.

13. The device according to claim 11, wherein
the second metal plate includes a trench provided at the front surface of the second metal plate.

14. The device according to claim 11, wherein
the first resin layer has a layer thickness in a first direction perpendicular to the back surface of the first resin layer, the layer thickness of the first resin layer being greater than thicknesses of the first and second metal plates in the first direction.

15. The device according to claim 11, further comprising:
a third metal plate away from the first metal plate, the third metal plate being provided next to the first metal plate in a second direction along the back surface of the first metal plate;
a fourth metal plate away from the second metal plate, the fourth metal plate being provided next to the second metal plate in the second direction, the first resin layer extending between the third metal plate and the fourth metal plate, between the first metal plate and the third metal plate, and between the second metal plate and the fourth metal plate, the back surface of the first resin layer being flush and aligned with a back surface of the third metal plate and a back surface of the fourth metal plate; and
a second switching element provided on a front surface of the fourth metal plate, the second switching element being electrically connected to the light-receiving element, the switching element and the fourth metal plate,
the second resin layer further covering the front surface of the third metal plate, the front surface of the fourth metal plate, and the second switching element.

16. The device according to claim 11, wherein
the switching element hash a back surface bonded to the front surface of the second metal plate, and
the back surface of the switching element has an area less than the front surface of the second metal plate.

* * * * *